United States Patent
Kitajima et al.

(10) Patent No.: US 7,151,321 B2
(45) Date of Patent: Dec. 19, 2006

(54) LAMINATED ELECTRONIC COMPONENT

(75) Inventors: Hiromichi Kitajima, Takefu (JP); Keiji Ogawa, Fukui (JP); Mitsuhide Kato, Sabae (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/860,133

(22) Filed: Jun. 4, 2004

(65) Prior Publication Data

US 2004/0256714 A1    Dec. 23, 2004

(30) Foreign Application Priority Data

Jun. 17, 2003 (JP) .............. 2003-171895

(51) Int. Cl.
*H01L 23/544* (2006.01)
(52) U.S. Cl. .................. 257/797; 257/E23.179
(58) Field of Classification Search ........ 257/700, 257/698, 774
See application file for complete search history.

(56) References Cited

U.S. PATENT DOCUMENTS

| | | | | |
|---|---|---|---|---|
| 5,686,759 A | * | 11/1997 | Hyde et al. | 257/730 |
| 6,110,806 A | * | 8/2000 | Pogge | 438/458 |
| 6,268,616 B1 | * | 7/2001 | Kamekawa | 257/48 |
| 6,392,289 B1 | * | 5/2002 | Tandy | 257/678 |
| 6,812,477 B1 | * | 11/2004 | Matsunami | 250/548 |
| 2002/0036357 A1 | * | 3/2002 | Sugiyama | 257/797 |
| 2002/0076896 A1 | * | 6/2002 | Farrar et al. | 438/401 |
| 2003/0180670 A1 | * | 9/2003 | Hasegawa et al. | 430/494 |
| 2004/0075179 A1 | * | 4/2004 | Liu et al. | 257/797 |

FOREIGN PATENT DOCUMENTS

| | | |
|---|---|---|
| JP | 61-158190 | 7/1986 |
| JP | 61-232694 | 10/1986 |
| JP | 04-342195 | 11/1992 |
| JP | 10-190170 | 7/1998 |
| JP | 2002-270432 | 9/2002 |

\* cited by examiner

*Primary Examiner*—Evan Pert
*Assistant Examiner*—Benjamin P. Sandvik
(74) *Attorney, Agent, or Firm*—Keating & Bennett, LLP

(57) ABSTRACT

A laminated electronic component includes a laminate having first and second major surfaces. Four predetermined indication locations are provided on the first major surface. One or more via-hole conductors are arranged at corresponding one or more of the indication locations. The locations and the number of indicating via-hole conductors allows for identification of information regarding the laminated electronic component. Each indicating via-hole conductor is exposed at the first major surface, does not reach the second major surface, and is electrically isolated from wiring conductors built into the laminate.

19 Claims, 4 Drawing Sheets

FIG. 3

| MONTH OF MANUFACTURE | POSITION OF INDICATING VIA-HOLE CONDUCTOR | MONTH OF MANUFACTURE | POSITION OF INDICATING VIA-HOLE CONDUCTOR |
|---|---|---|---|
| JANUARY | upper right | JULY | upper right, lower right |
| FEBRUARY | upper left | AUGUST | upper left, lower left |
| MARCH | lower left | SEPTEMBER | upper right, lower left |
| APRIL | lower right | OCTOBER | upper left, lower right |
| MAY | upper left, upper right | NOVEMBER | upper left, lower left, lower right |
| JUNE | lower left, lower right | DECEMBER | upper right, lower left, lower right |

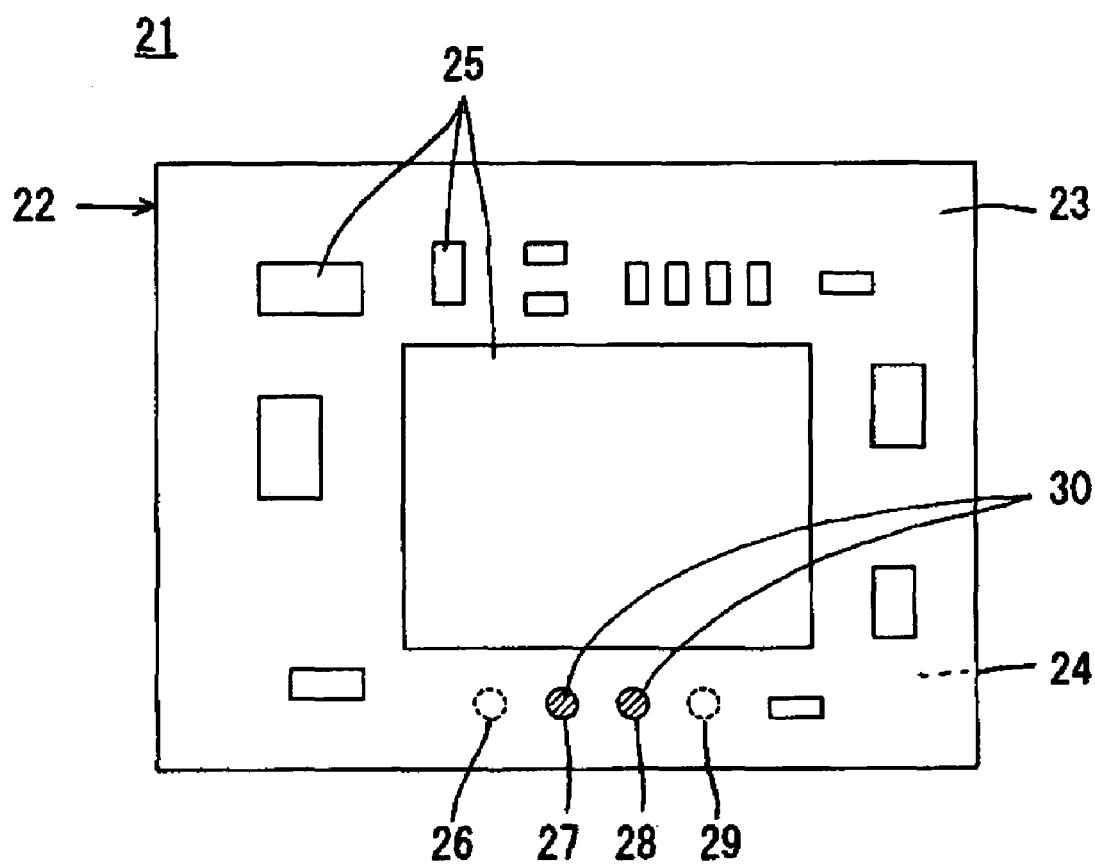

LAMINATED ELECTRONIC COMPONENT

BACKGROUND OF THE INVENTION

1. Field of the Invention

The present invention relates to laminated electronic components, and more particularly, to a laminated electronic component on which information, such as the time of manufacture, a specification, or a manufacturing condition, is indicated.

2. Description of the Related Art

Product information, such as time of manufacture, product lot numbers, and specifications, is often indicated on various electronic components.

For example, Japanese Unexamined Patent Application Publication Nos. 61-158190 (Patent document 1) and 61-232694 (Patent Document 2) disclose related technologies that are applied to printed circuit boards. In Patent Document 1, a plurality of through holes are provided at respective locations of a printed circuit board, and only desired through holes are sealed to provide a predetermined code, such that specific information is indicated. In Patent Document 2, a plurality of locations at which through-holes for indicating specific information are to be provided are predetermined, and through holes are provided at some of the locations in accordance with information to be indicated.

The technologies disclosed in Patent Documents 1 and 2 described above are both directed to printed circuit boards that have no built-in wiring conductors and that, therefore, have no built-in devices.

On the other hand, for example, for laminated electronic components including laminates, such as multilayer ceramic substrates, the laminates have built-in wiring conductors for providing built-in devices. When the technology described in Patent Document 1 or 2 is applied to such laminated electronic components, the following problems arise.

First, in the technologies described in Patent Documents 1 and 2 through-holes are provided. However, the provision of such through-holes in a laminate included in a laminated electronic component makes it impossible to arrange wiring conductors at locations where the through-holes are provided. Thus, regions where wiring conductors can be arranged in the laminate are limited, which prevents miniaturization of the laminated electronic component.

When a laminate is defined by a multilayer ceramic substrate, the through-holes provided therein cause a problem in that a mechanical failure, such as a crack, is more likely to occur.

SUMMARY OF THE INVENTION

In order to overcome the problems described above, preferred embodiments of the present invention provide a laminated electronic component that overcomes the above-described problems.

The present invention is directed to a laminated electronic component having a laminate. The laminate includes a plurality of laminated insulating layers, first and second major surfaces that oppose each other, and built-in wiring conductors.

In this laminated electronic component, information regarding the laminated electronic component is indicated in an identifiable manner according to whether or not a specific indication is present at each of a plurality of pre-defined locations on the first major surface of the laminate.

In order to overcome the technical problems described above, in the present invention, each specific indication is provided by an indicating via-hole conductor provided in the laminate. Each indicating via-hole conductor does not extend to the second major surface, is electrically isolated from the wiring conductors, and is seen from a first major surface side. With this arrangement, regions where wiring conductors can be arranged in the laminate are not substantially limited by the formation of the indicating via-hole conductors. This prevents the size of the laminated electronic component from increasing as a result of indication of information regarding the laminated electronic component.

Further, the indicating via-hole conductors can be formed by a method similar to that for via-hole conductors that function as wiring conductors provided in the laminate. Thus, providing the indicating via-hole conductors does not decrease the productivity of laminated electronic components.

Additionally, there is no need to provide a through hole in the laminate to indicate information regarding the laminated electronic component. Thus, even when the laminate is defined by a multilayer ceramic substrate, the present invention eliminates mechanical failures, such as a crack, from occurring as a result of the formation of the through hole.

Preferably, each indicating via-hole conductor is exposed at the first major surface.

In the present invention, the laminated electronic component may further include a component that is mounted above the first major surface of the laminate. In this case, each indicating via-hole conductor may be provided at the location of the mounted component or may be provided at a location other than the location of the mounted component.

In the present invention, in a case in which the mounted component is located above the first major surface of the laminate, when the indicating via-hole conductors are provided at the location of the mounted component, the indicating via-hole conductors are hidden by the mounted component in a completed laminated electronic component. Thus, it is possible to prevent the indicating via-hole conductors from degrading the appearance. In addition, it is possible to provide a relatively large area for indication locations for the indicating via-hole conductors, since the indication locations for the indicating via-hole conductors are not limited by the location of the mounted component. Further, since the first major surface is not substantially occupied for the indication locations for the indicating via-hole conductors, the first major surface can be effectively used.

On the other hand, in the case in which the indicating via-hole conductors are provided at a location other than the location of the mounted component, even when the laminated electronic component is completed, it is possible to facilitate identification of the indicating via-hole conductors through visual observation or image processing, thereby allowing for immediate identification of information regarding the laminated electronic component.

Additionally, in the present invention, a mark for identification of a direction of the laminate may be provided on the first major surface of the laminate, as required. This arrangement reduces incorrect identification of information indicated by the indicating via-hole conductors, regardless of the arrangement of conducting lands and other elements on the first major surface. In addition, the kinds of information that can be indicated are increased by a combination of the mark and the indicating via-hole conductors.

These and various other features, elements, characteristics and advantages of the present invention will become more apparent from the following detailed description of preferred embodiments thereof with reference to the attached drawings.

BRIEF DESCRIPTION OF THE DRAWINGS

FIG. 3 is a table of an example illustrating the relationships between the month of manufacture and the locations of indicating via-hole conductors 18 shown in FIG. 1 when information provided by the indicating via-hole conductors 18 is the month of manufacture; and FIG. 4 is a plan view of a laminated electronic component 21 according to another preferred embodiment of the present invention.

DETAILED DESCRIPTION OF PREFERRED EMBODIMENTS

Figure 1:
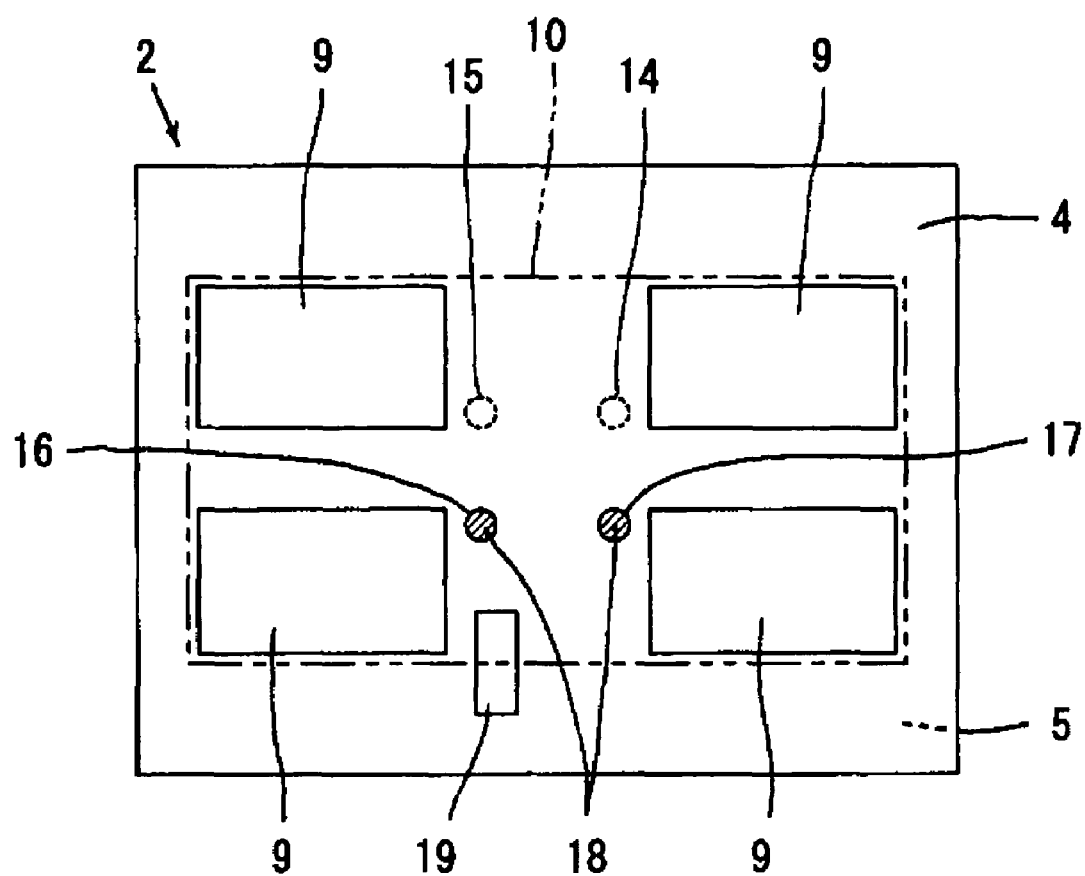
FIG. 1 is a plan view of a laminate 2 included in a laminated electronic component 1 according to a first preferred embodiment of the present invention.
Figure 2:
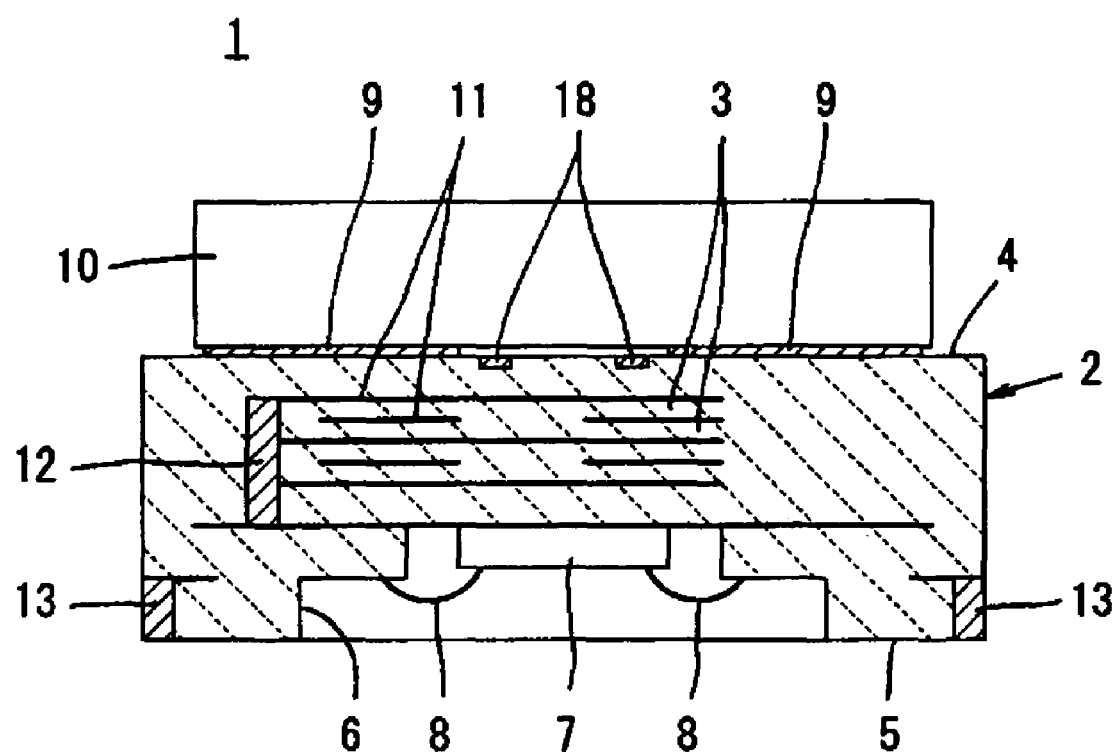
FIG. 2 is a partial sectional front view of the laminated electronic component 1 including the laminate 2 shown in FIG. 1.

FIG. 1 is a plan view of a laminate 2 included in a laminated electronic component 1 according to a first preferred embodiment of the present invention, and FIG. 2 is a partial sectional front view of the laminated electronic component 1 including the laminate 2 shown in FIG. 1.

The laminate 2 defines a multilayer ceramic substrate. As clearly shown in FIG. 2, the laminate 2 includes a plurality of laminated insulating layers 3 and has first and second major surfaces 4 and 5 that oppose each other. The second major surface 5 of the laminate 2 includes a cavity 6, in which a chip component 7, such as an IC chip, is accommodated. The chip component 7 and wiring conductors of the laminate 2 are connected via, for example, wires 8 by wire bonding.

The first major surface 4 of the laminate 2 includes conducting lands 9. A chip component 10, such as a crystal oscillator, is mounted above the first major surface 4 of the laminate 2 and is electrically isolated from the conducting lands 9. In FIG. 1, the chip component 10 is shown by an imaginary line.

The laminate 2 includes built-in wiring conductors for providing predetermined functions. Of the wiring conductors, only typical ones are illustrated in FIG. 2. As shown in FIG. 2, the wiring conductors include a plurality of conductive films 11 and a plurality of via-hole conductors 12. Some of the conductive films 11 define passive devices, such as a capacitor. Edges of the second major surface 5 of the laminate 2 include terminal conductors 13.

In the laminated electronic component 1 having the above-described structure, information regarding this laminated electronic component 1 is indicated on the first major surface 4 of the laminate 2. In this preferred embodiment, the month of manufacture is indicated as the time of manufacture of the laminated electronic component 1.

More specifically, for example, four indication locations 14 to 17 are pre-defined on the first major surface 4 of the laminate 2. Information regarding the month of manufacture is indicated in an identifiable manner according to whether or not a specific indication is shown on each of the four indication locations 14 to 17. Specifically, each specific indication is provided by an indicating via-hole conductor 18. In the case of FIG. 1, at the indication locations 16 and 17, indications are provided by the indicating via-hole conductors 18. The indication locations 14 and 15 have neither indicating via-hole conductors nor holes.

The indicating via-hole conductors 18 are formed by a similar method to that for the via-hole conductors 12, which function as wiring conductors. As is clearly shown in FIG. 2, each indicating via-hole conductor 18 is exposed at the first major surface 4 but does not reach the second major surface 5, and is electrically isolated from any of the wiring conductors, such as the conductive films 11 and the via-hole conductors 12.

The indicating via-hole conductors 18 are obtained by firing conductive paste containing metal powder, such as silver or copper. When the laminate 2 is defined by a multilayer ceramic substrate, the insulating layers 3 are made of ceramic. Thus, this arrangement provides a distinctive difference in color tone or gloss between the first major surface 4 of the laminate 2 and the indicating via-hole conductors 18. This ensures that the indicating via-hole conductors 18 can be identified by an optical method, such as visual observation or image processing.

In this preferred embodiment, when four indication locations 14 to 17 are provided, the indicating via-hole conductors 18 as shown at "Location of Indicating Via-hole Conductor" shown in FIG. 3 allow the month of manufacture from January to December to be indicated. In FIG. 3, each indicating via-hole conductor 18 is shown by a black dot. Four individual regions corresponding to the four indication locations 14 to 17 are provided in order to facilitate the understanding of the location of each indicating via-hole conductor 18.

Referring to FIG. 3, for example, when the month of manufacture is January, the indicating via-hole conductor 18 is provided at the indication location 14, as can be understood from the location of the black dot. When the indicating via-hole conductors 18 are provided at the indication locations 16 and 17 as shown in FIG. 1, this indicates that the month of manufacture is June, as can be seen from FIG. 3.

As described above, when four indication locations 14 to 17 are used, four other kinds (not shown) of indication are available in addition to the 12 kinds of indication shown in FIG. 3, so that a total of 16 kinds of indication are possible.

The locations and the numbers of the indicating via-hole conductors 18 shown in FIG. 3 are merely an example, and many other variations may be employed.

As shown in FIG. 1, the first major surface 4 of the laminate 2 is longitudinally and laterally symmetrical with respect to the conducting lands 9 and the indication locations 14 to 17. As a result, for example, in some cases, it is impossible to clearly distinguish between a case in which the indicating via-hole conductors 18 are provided at the indication locations 16 and 17 as shown in FIG. 1 and a case (not shown) in which the indicating via-hole conductors 18 are provided at the indication locations 14 and 15.

Typically, many laminated electronic components are provided with marks for identification of the directions thereof. In this preferred embodiment, a mark 19 for identification of the laminate 2 is provided on the first major surface 4 of the laminate 2. The mark 19 can be provided by a similar method to that for the conducting lands 9.

Thus, the provision of the mark 19 as described above allows identification of the longitudinal and lateral directions of the laminate 2. This makes it possible to clearly distinguish between the case in which the indicating via-hole conductors 18 are provided at the indication locations 16 and 17 as shown in FIG. 1 and the case in which the indicating via-hole conductors 18 are provided at the indication locations 14 and 15.

In the preferred embodiment described with reference to FIGS. 1 and 2, the indicating via-hole conductors 18 are provided at locations that are hidden under the chip component 10 mounted above the first major surface 4. Each indicating via-hole conductor 18, however, may be provided at a location other than the location of the mounted component, as is described below with reference to FIG. 4.

FIG. 4 is a plan view of a laminated electronic component 21 according to another preferred embodiment of the present invention.

The laminated electronic component 21 includes a laminate 22. As in the laminate 2 shown in FIG. 2, the laminate 22 includes a plurality of laminated insulating layers (not shown) and has first and second major surfaces 23 and 24 that oppose each other. The laminate 22 further has built-in wiring conductors (not shown).

A plurality of chip components 25 are mounted on the first major surface 23 of the laminate 22. On the first major surface 23 of the laminate 22, for example, four indication locations 26 to 29 are arranged in a row at locations where the chip components 25 are not provided. In the case of FIG. 4, indicating via-hole conductors 30 are provided at the indication locations 27 and 28. The indication locations 26 and 29 have neither indicating via-hole conductors nor holes.

In this preferred embodiment as well, the month of manufacture from January to December can be indicated in an identifiable manner according to whether or not the indicating via-hole conductor 30 is present at each of the four indication locations 26 to 29. For example, for January to April, the indicating via-hole conductor 30 is provided at one of the indication locations 26 to 29; for May to October, the indicating via-hole conductors 30 are provided at two of the indication locations 26 to 29; and for November and December, the indicating via-hole conductors 30 are provided at three of the indication locations 26 to 29. This arrangement allows the month of manufacture to be indicated in an identifiable manner.

While the present invention has been described above in connection with the illustrated preferred embodiments, various other modifications are possible within the spirit and scope of the present invention.

For example, the number and the geometry of indication locations can be arbitrarily changed. Increasing the number of indication locations also allows for identification of not only the month of manufacture but also the year of manufacture.

The size or shape of each of the indicating via-hole conductors provided at the respective indication locations may be changed depending on information to be indicated. When a plurality of indicating via-hole conductors are provided, different colors may be used among the indicating via-hole conductors. For example, conductive paste containing silver and conductive paste containing copper may be used to form the indicating via-hole conductors. Such modifications can further increase the kinds of information that can be indicated.

Holes for the indicating via-hole conductors may be pre-provided at all the indication locations in such a manner that the holes do not extend through the laminate and do not reach the wiring conductors. In such a case, only the necessary holes may be filled with the indicating via-hole conductor(s). Such an arrangement enables for clear identification of predetermined indication location(s) in accordance with the presence of hole(s).

Information indicated by the indicating via-hole conductors is not limited to the above-mentioned month of manufacture, and may be information representing other time of manufacture, such as the year/month/day of manufacture or the year of manufacture. In such a manner, with the time of manufacture being indicated on laminated electronic components, when shipped products have a problem, it is possible to identify the cause of a change in a manufacturing condition and so on and to distinguish between problematic lots and regular lots.

Information indicated by the indicating via-hole conductors may be a specification of laminated electronic components or a manufacturing condition, such as a firing profile for providing laminates or a soldering profile of components to be mounted.

In the illustrated preferred embodiments, the indicating via-hole conductors 18 and 30 are provided so as to be exposed at the respective first major surfaces 4 and 23. However, when the laminate is defined by a multilayer ceramic substrate, the indicating via-hole conductors may be provided in a layer (e.g., the second or third layer) adjacent to the first major surface, since the internal wiring conductors are seen through a layer or layers adjacent to the first major surface. The above-described arrangement can prevent incorrect identification resulting from undesired breakage of, for example, the indicating via-hole conductors. When the indicating via-hole conductors are provided at locations disposed under a component, solder may attach to the indicating via-hole conductors during the soldering of the component, thereby preventing the component from being displaced.

It should be understood that the foregoing description is only illustrative of the present invention. Various alternatives and modifications can be devised by those skilled in the art without departing from the present invention. Accordingly, the present invention is intended to embrace all such alternatives, modifications and variations that fall within the scope of the appended claims.

What is claimed is:

1. A laminated electronic component comprising:
   a laminate that includes a plurality of laminated insulating layers, said laminate having first and second major surfaces that oppose each other and built-in wiring conductors; wherein
   information regarding the laminated electronic component is indicated in an identifiable manner according to whether or not a specific indication is present at each of a plurality of predetermined locations on the first major surface of the laminate;
   each specific indication is provided by an indicating via-hole conductor provided in the laminate, wherein each indicating via-hole conductor does not extend to the second major surface, is electrically isolated from the wiring conductors, and is seen from a first major surface side; and
   each of the plurality of laminated insulating layers is made of ceramic material.

2. The laminated electronic component according to claim 1, wherein each indicating via-hole conductor is exposed at the first major surface.

3. The laminated electronic component according to claim 1, further comprising a component that is mounted above the first major surface of the laminate, wherein each indicating via-hole conductor is provided at the location disposed under the mounted component.

4. The laminated electronic component according to claim 1, further comprising a component that is mounted above the first major surface of the laminate, wherein each indicating via-hole conductor is provided at a location other than under the location of the mounted component.

5. The laminated electronic component according to claim 1, wherein a mark for identification of a direction of the laminate is provided on the first major surface of the laminate.

6. The laminated electronic component according to claim 1, wherein said information includes the month of manufacture of the laminated electronic component.

7. The laminated electronic component according to claim 1, wherein said information includes the month and year of manufacture of the laminated electronic component.

8. The laminated electronic component according to claim 1, wherein said information includes specifications of the laminated electronic component.

9. The laminated electronic component according to claim 1, wherein said plurality of predetermined locations includes four predetermined locations.

10. A laminated electronic component comprising:
a laminate that includes a plurality of laminated insulating layers, said laminate having first and second major surfaces that oppose each other; wherein
information regarding the laminated electronic component is indicated in an identifiable manner according to whether or not a specific indication is present at each of a plurality of predetermined locations on the first major surface of the laminate;
each specific indication is provided by an indicating via-hole conductor provided in the laminate, wherein each indicating via-hole conductor does not extend to the second major surface, and is seen from a first major surface side; and
each of the plurality of laminated insulating layers is made of ceramic material.

11. The laminated electronic component according to claim 10, wherein said laminated further includes built-in wiring conductors, and each of said indicating via-hole conductors is electrically isolated from the wiring conductors.

12. The laminated electronic component according to claim 10, wherein each indicating via-hole conductor is exposed at the first major surface.

13. The laminated electronic component according to claim 10, further comprising a component that is mounted above the first major surface of the laminate, wherein each indicating via-hole conductor is provided at the location disposed under the mounted component.

14. The laminated electronic component according to claim 10, further comprising a component that is mounted above the first major surface of the laminate, wherein each indicating via-hole conductor is provided at a location other than under the location of the mounted component.

15. The laminated electronic component according to claim 10, wherein a mark for identification of a direction of the laminate is provided on the first major surface of the laminate.

16. The laminated electronic component according to claim 10, wherein said information includes the month of manufacture of the laminated electronic component.

17. The laminated electronic component according to claim 10, wherein said information includes the month and year of manufacture of the laminated electronic component.

18. The laminated electronic component according to claim 10, wherein said information includes specifications of the laminated electronic component.

19. The laminated electronic component according to claim 10, wherein said plurality of predetermined locations includes four predetermined locations.

* * * * *